US008253429B2

(12) United States Patent
Lee et al.

(10) Patent No.: US 8,253,429 B2
(45) Date of Patent: Aug. 28, 2012

(54) PROBE CARD HAVING A PLURALITY OF SPACE TRANSFORMERS

(75) Inventors: Yong Goo Lee, Seoul (KR); Maeng Youl Lee, Seoul (KR)

(73) Assignee: Gigalane Co., Ltd., Suwon-si (KR)

( * ) Notice: Subject to any disclaimer, the term of this patent is extended or adjusted under 35 U.S.C. 154(b) by 237 days.

(21) Appl. No.: 12/674,277

(22) PCT Filed: Jan. 8, 2008

(86) PCT No.: PCT/KR2008/000084
§ 371 (c)(1),
(2), (4) Date: Feb. 19, 2010

(87) PCT Pub. No.: WO2009/025427
PCT Pub. Date: Feb. 26, 2009

(65) Prior Publication Data
US 2011/0121851 A1    May 26, 2011

(30) Foreign Application Priority Data

Aug. 23, 2007    (KR) .................. 10-2007-0085147

(51) Int. Cl.
*G01R 31/20*    (2006.01)
(52) U.S. Cl. .......... 324/754.07; 324/756.03; 324/756.07
(58) Field of Classification Search ............. 324/755.08, 324/755.06
See application file for complete search history.

(56) References Cited

U.S. PATENT DOCUMENTS

| | | | | |
|---|---|---|---|---|
| 5,818,249 A * | 10/1998 | Momohara | ............... | 324/756.03 |
| 5,974,662 A * | 11/1999 | Eldridge et al. | ................ | 29/842 |
| 6,359,452 B1 * | 3/2002 | Mozzetta | ................. | 324/750.25 |
| 6,407,566 B1 * | 6/2002 | Brunelle et al. | ......... | 324/756.02 |
| 6,499,216 B1 * | 12/2002 | Fjelstad | ........................... | 29/842 |
| 6,727,579 B1 * | 4/2004 | Eldridge et al. | .............. | 257/692 |
| 6,956,386 B2 * | 10/2005 | Kim et al. | ................. | 324/754.07 |
| 7,049,837 B2 * | 5/2006 | Kasukabe et al. | ........ | 324/754.07 |
| 7,129,730 B2 * | 10/2006 | Liu et al. | .................. | 324/750.25 |
| 7,285,968 B2 * | 10/2007 | Eldridge et al. | ......... | 324/750.03 |
| 7,307,433 B2 * | 12/2007 | Miller et al. | ............. | 324/756.03 |
| 7,466,152 B2 * | 12/2008 | Shioga et al. | ............. | 324/756.03 |
| 7,511,519 B2 * | 3/2009 | Kimoto | .................... | 324/755.08 |
| 7,579,848 B2 * | 8/2009 | Bottoms et al. | .......... | 324/756.03 |

FOREIGN PATENT DOCUMENTS

| | | |
|---|---|---|
| KR | 10-0610803 B1 | 7/2006 |
| KR | 10-0661254 B1 | 7/2006 |

* cited by examiner

*Primary Examiner* — Richard Isla Rodas
(74) *Attorney, Agent, or Firm* — Stein McEwen, LLP

(57) ABSTRACT

A probe card of a semiconductor test apparatus having a plurality of space transformers supporting probe units of the probe card is provided. A probe card of the present invention includes a plurality of probe units, each comprising a guide member and at least one probe secured by the guide member and contacting a chip pad to be tested; a plurality of space transformers arranged below the respective probe units, each space transformer having wires electrically connected to lower terminals of the probes; a frame having a plurality of guide holes for fixedly positioning the respective probe units; an interposer array arranged below the space transformers for supporting the space transformers, interposer array comprising electrical connection means for supplying test signals to the wires of the space transformers; and a printed circuit board arranged below the interposer array for supporting the interposer array and electrically connected to the electrical connection means for supplying the test signals. In the probe card of the present invention, the probe units are independently supported by respective space transformers such that it is possible to reduce thermal distortion of the probe card and simplifying the manufacturing and repairing processes.

5 Claims, 6 Drawing Sheets

[Fig. 1]
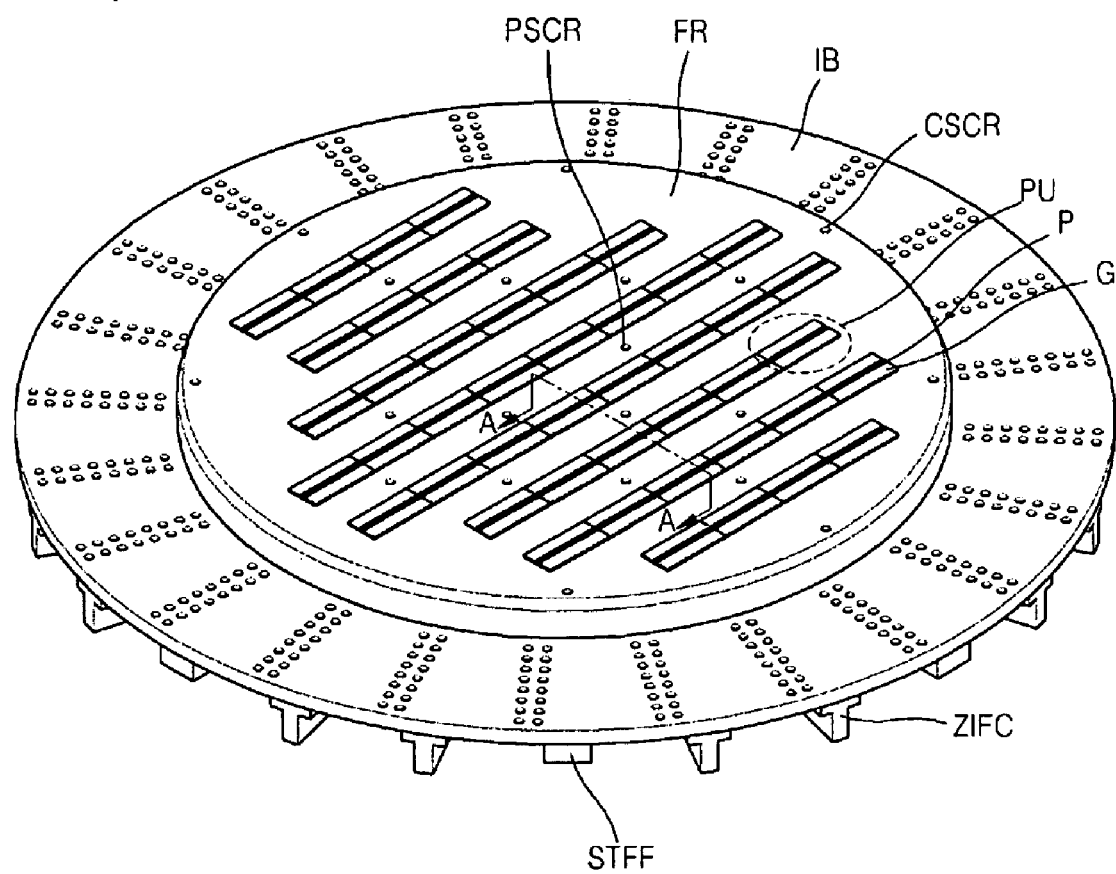

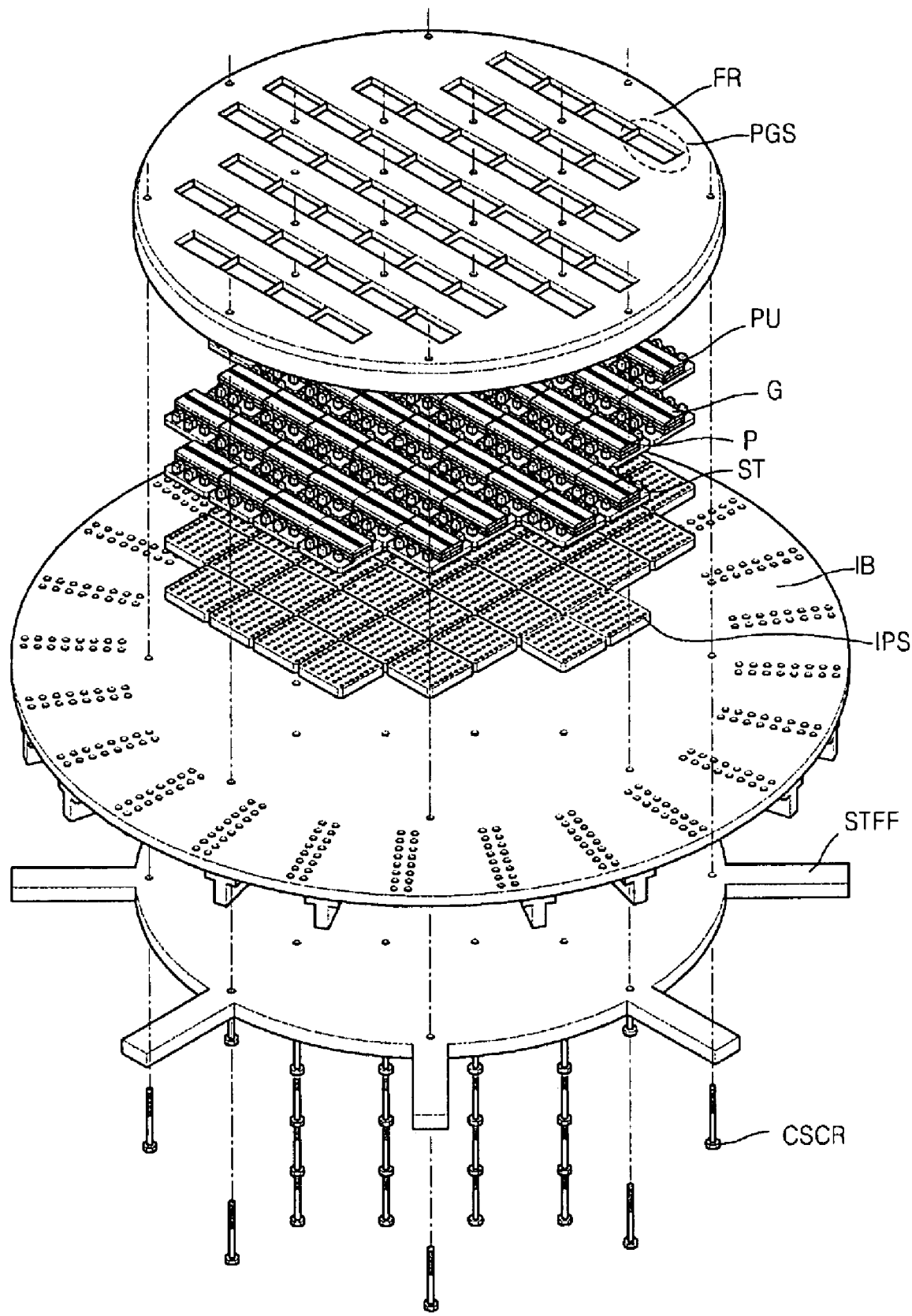
[Fig. 2]

[Fig. 3]
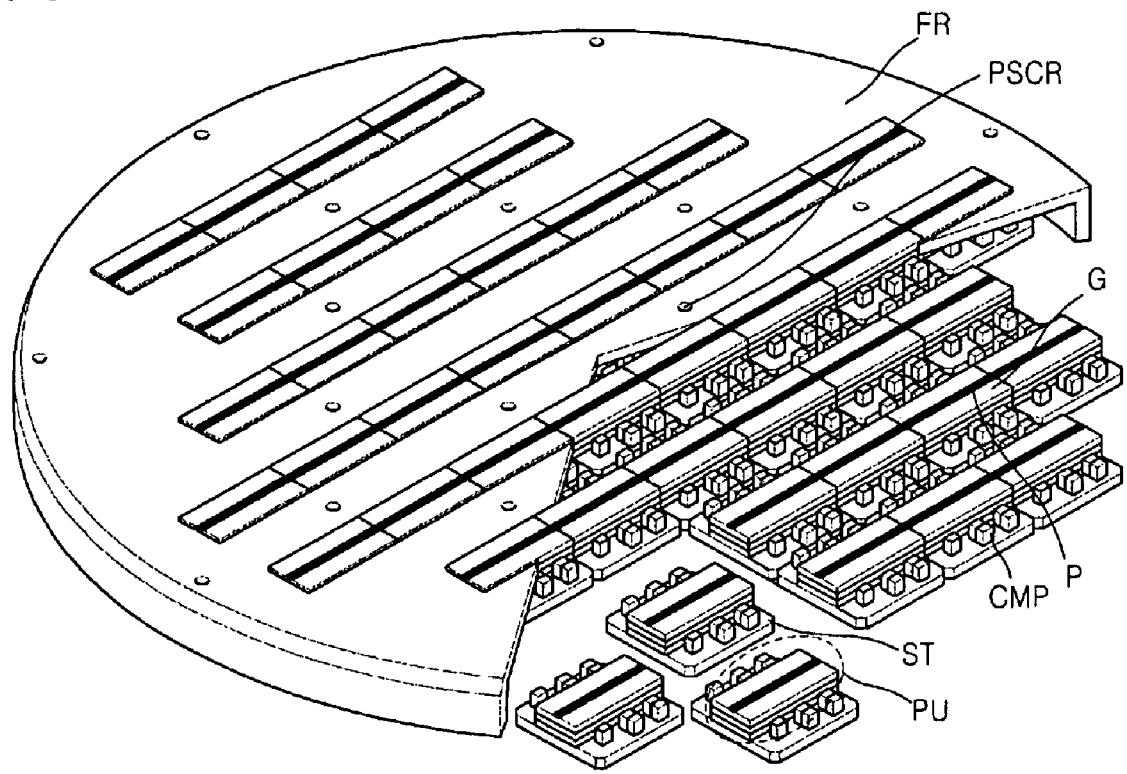
[Fig. 4]
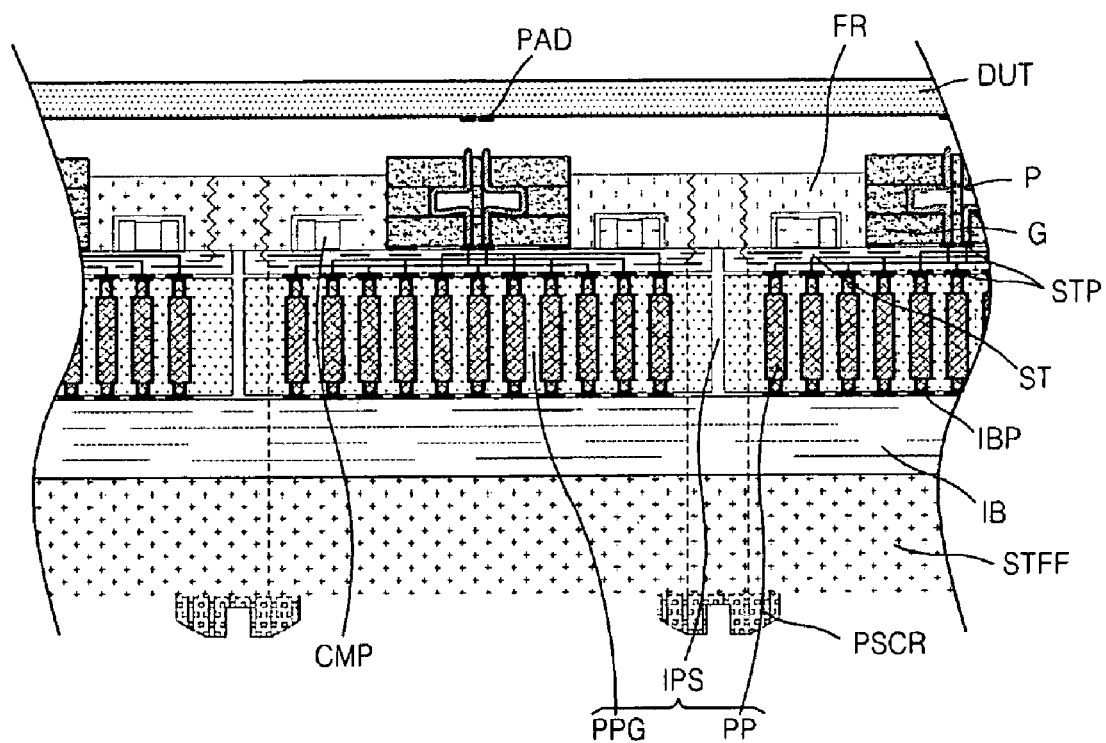

[Fig. 5]
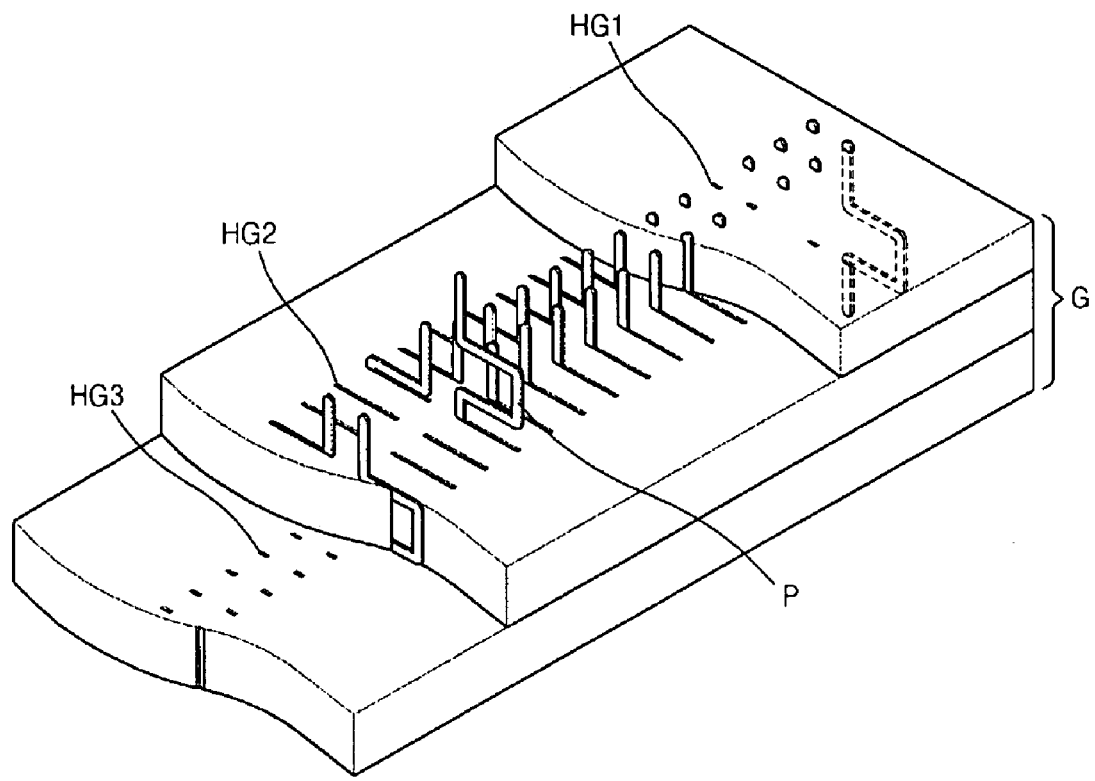
[Fig. 6]
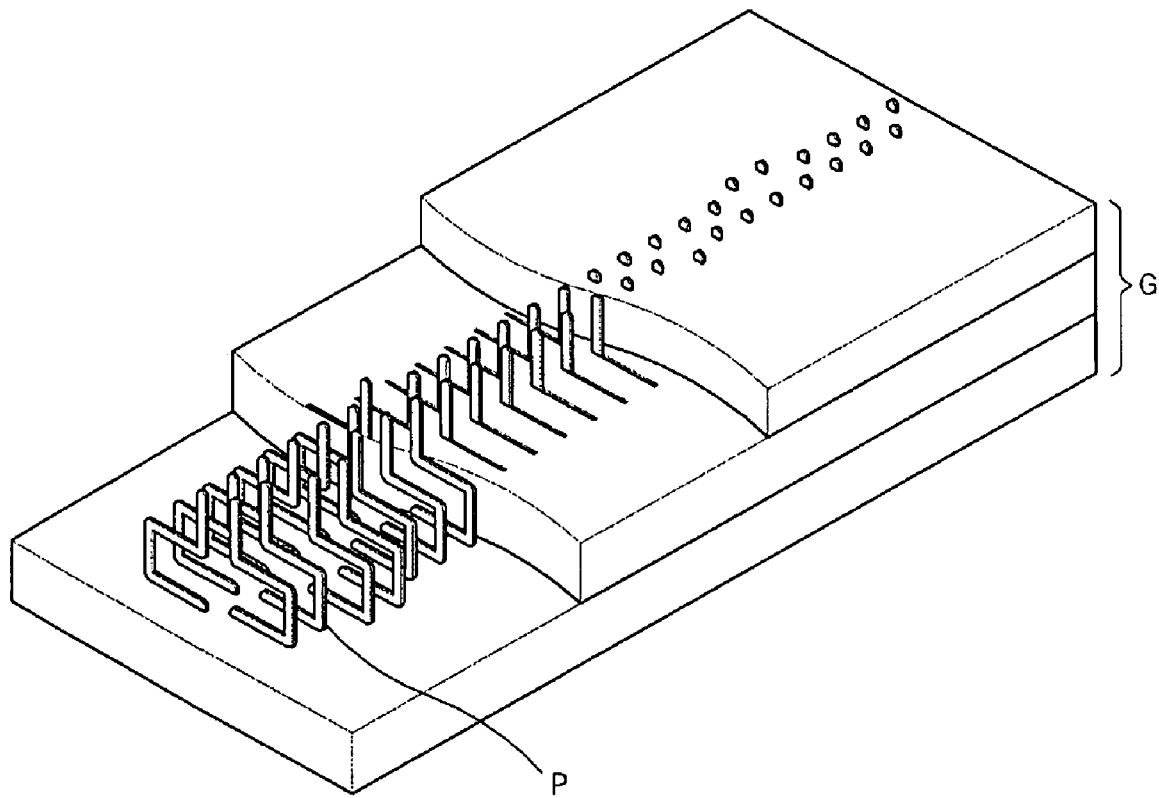

[Fig. 7]
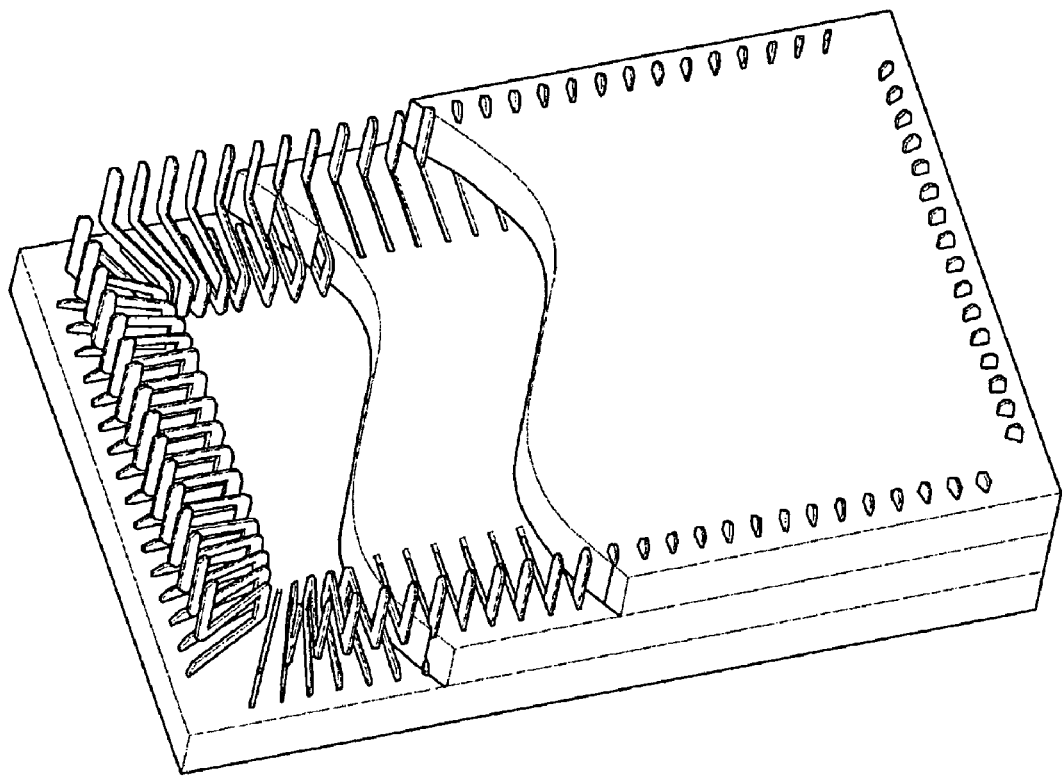
[Fig. 8]
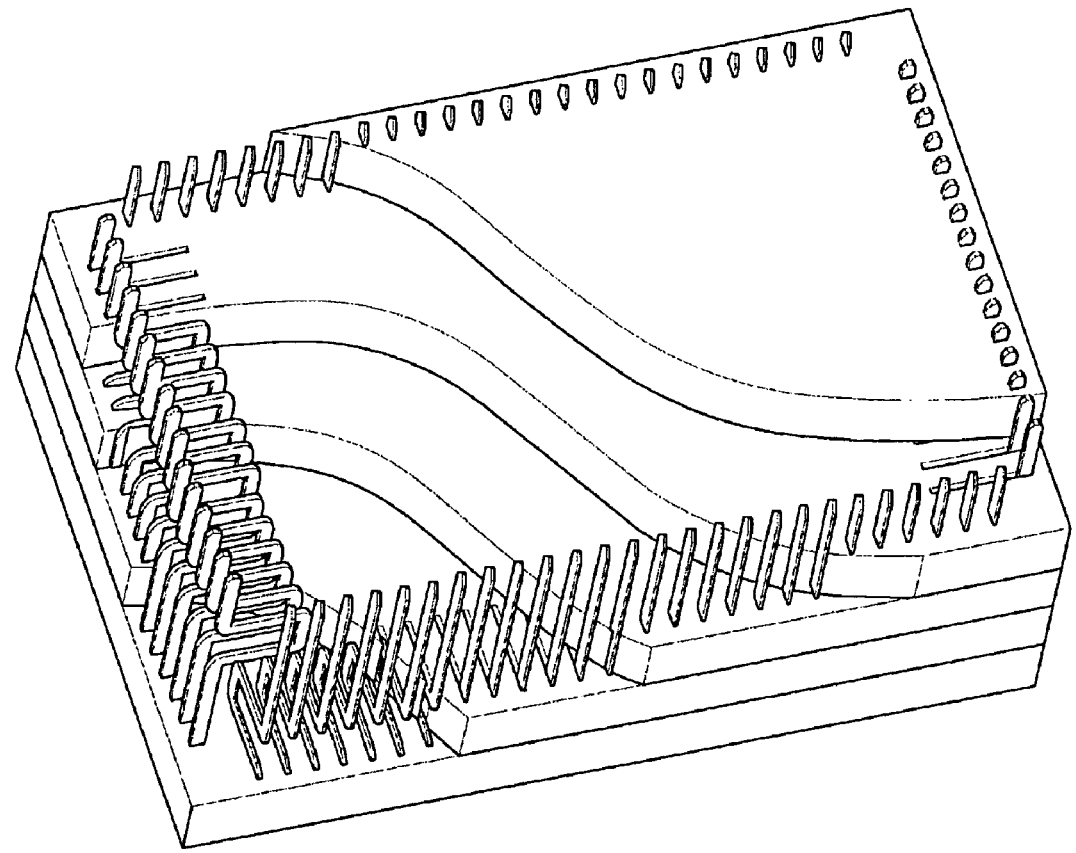

[Fig. 9]
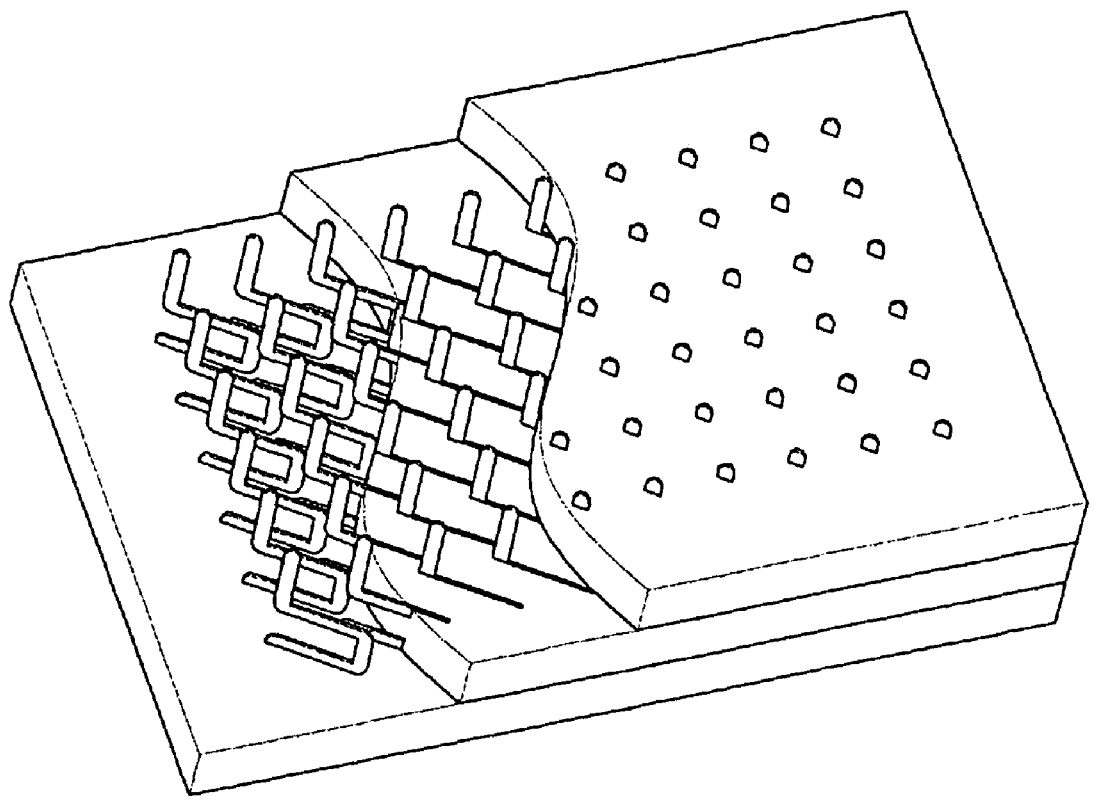
[Fig. 10]
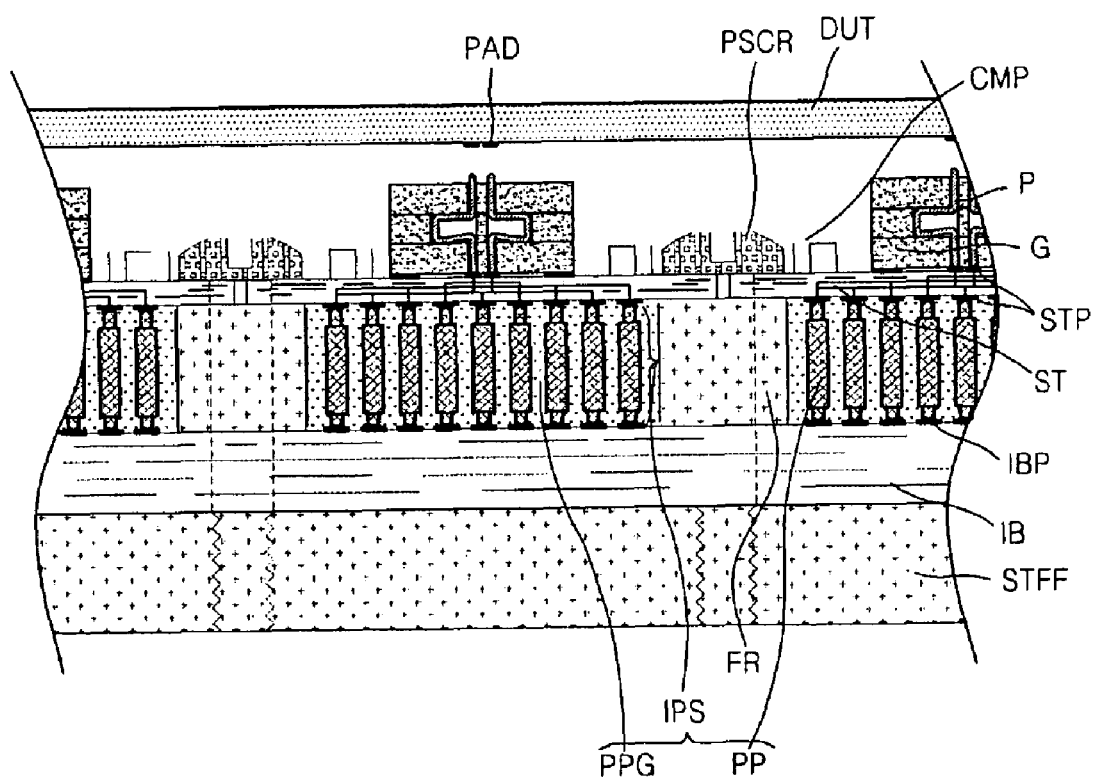

PROBE CARD HAVING A PLURALITY OF SPACE TRANSFORMERS

This is a National Phase Application filed under 35 U.S.C. 371 of PCT/KR2008/000084, filed Jan. 8, 2008, an application claiming foreign priority benefits under 35 U.S.C. 119 of Korean Application No. 10-2007-0085147, filed Aug. 23, 2007, the entire content of which is hereby incorporated by reference.

TECHNICAL FIELD

The present invention relates to a semiconductor test apparatus and, in particular, to a probe card of a semiconductor test apparatus having a space transformer array supporting probe units of the probe card.

BACKGROUND ART

When fabricating semiconductor chips on a wafer are completed, the chips are tested during or after fabrication process or before packaging process for evaluating their designed electrical characteristics partially or entirely.

A probe station is one of the most popular tools for making measurements on the integrated circuits. The probe station is provided with a probe card holder for holding a probe card which applies electric signal to pads of the chips formed on the wafer.

Typically, the probe card is composed of a printed substrate and a plurality of probes mounted on the printed substrate. The printed substrate has a circuitry for electrically connecting probing devices and the probes. The probes are contacted the pads of the chips to be tested.

The wafer placed on a chuck is moved along the x-axis and y-axis to be aligned on the probe card such that the probes are positioned on the respective pads of the chips. And then, the chuck moves in z-axis such that the tips of the probes contact the pads of the chips.

The chips are tested by transmitting electrical signals generated by probe station to the chips via wires patterned on the printed substrate and probe tips.

With the advance of the semiconductor fabrication technologies, a wafer increases in size and, in turn, the number of chips per wafer increases for the purpose of reduction of manufacturing cost and improvement of productivity. In order to effectively test more highly integrated chips on the large wafer, the probe card also becomes larger in size. Such a probe card having a capability to test multiple chips is called a multi-para probe card.

The multi-para probe card is manufactured by transferring cantilever-type probes fabricated by a Micro Electro-Mechanical System (MEMS) and then removing a sacrificial layer after bonding the probes on a ceramic substrate. Here, the ceramic substrate acts as a space transformer for changing the probes from fine pitch to coarse pitch. The ceramic substrate is used since its thermal expansion coefficient and thermal contraction coefficient are similar to those of the silicon wafer. By using the ceramic substrate, it is possible to minimize mismatch between probe tips and chip pads caused by the thermal expansion or contraction of the substrate.

However, the conventional probe card has a drawback in that the probe terminals and the pads of the chips to be tested are mismatched when the temperature changes excessively since the thermal expansion coefficients of the silicon and ceramic are 2.6 ppm/and 6.0 ppm/, respectably. For example, when the temperature increases about 150 degree, the position displacement around the edge of the 12 wafer are 59 μm and 153 μm for the ceramic and the silicon. Accordingly, in a case that the chip pad size is smaller than 180 μm, the probe tip fails to contact the pad.

Also, the conventional probe card fabricated by bonding the cantilever-type probes on the ceramic substrate is disadvantageous in fabrication complexity. Particularly when the probe card is needed to be repaired, it is difficult or impossible to repair the probes individually.

DISCLOSURE OF INVENTION

Technical Problem

The present invention has been made in an effort to solve the above problems, and it is an object of the present invention to provide a probe card that is capable of protecting thermal distortion and facilitating fabrication and repair.

Technical Solution

In accordance with an aspect of the present invention, the above and other objects are accomplished by a probe card. The probe card includes a plurality of probe units, each comprising a guide member and at least one probe secured by the guide member and contacting a chip pad to be tested; a plurality of space transformers arranged below the respective probe units, each space transformer having wires electrically connected to lower terminals of the probes; a frame having a plurality of guide holes for fixedly positioning the respective probe units; an interposer array arranged below the space transformers for supporting the space transformers, interposer array comprising electrical connection means for supplying test signals to the wires of the space transformers; and a printed circuit board arranged below the interposer array for supporting the interposer array and electrically connected to the electrical connection means for supplying the test signals.

Preferably, each space transformer includes a multi-layered printed circuit board.

Preferably, each space transformer includes measurement devices arranged on an upper surface for enhancing test performance to a device to be tested.

Preferably, the frame is provided with a plurality of holes on a bottom surface for receiving the measurement devices, and the frame is made of any of Invar, Kovar, quartz, steel, and ceramic.

Preferably, the probe card further includes a plurality of flatness adjustment screws penetrating the frame, space transformers, interposer array, and printed circuit board, for adjusting flatness of an upper surface of the frame.

Preferably, each probe unit includes a guide having at least one set of upper hole, lower hole, and middle hole interconnecting the upper and lower holes, the middle hole being greater than the upper and lower holes in size; and at least one probe situated in the set of upper, lower, and middle holes and a tip of the probe contact a chip pad to be tested.

Preferably, the interposer array includes a plurality of interposers, and each interposer supports at least one space transformer.

In accordance with another aspect of the present invention, the probe card includes a plurality of probe units, each comprising a guide member and at least one probe secured by the guide member and contacting a chip pad to be tested; a plurality of space transformers arranged below the respective probe units, each space transformer having wires electrically connected to lower terminals of the probes; a plurality of interposers arranged below the space transformers for supporting the space transformers, each interposer comprising electrical connection means for supplying test signals to the wires of the space transformers; a frame arranged between the interposers below the space transformers for fixedly positioning the space transformers; and a printed circuit board arranged below the interposers and frame for supporting the interposer array and frame and electrically connected to the electrical connection means for supplying the test signals.

Preferably, each space transformer includes a multi-layered printed circuit board.

Preferably, each space transformer includes measurement devices arranged on an upper surface for enhancing test performance to a device to be tested.

Preferably, the probe card further includes a plurality of flatness adjustment screws penetrating the space transformers, frame, and printed circuit board, for adjusting flatness of an upper surface of the space transformers.

Preferably, each probe unit includes a guide having at least one set of upper hole, lower hole, and middle hole interconnecting the upper and lower holes, the middle hole being greater than the upper and lower holes in size; and at least one probe situated in the set of upper, lower, and middle holes and a tip of the probe contact a chip pad to be tested.

Preferably, each interposer supports at least one space transformer.

Preferably, the frame is made of any of Invar, Kobar, quartz, steel, and ceramic.

Advantageous Effects

The probe card of the present invention is advantageous since the probe card can be protected from thermal distortion and can be fabricated and repaired by probe unit by implemented with space transformer structures corresponding to modular probe units.

BRIEF DESCRIPTION OF THE DRAWINGS

FIG. 1 is a perspective view illustrating a configuration of a probe card according to an exemplary embodiment of the present invention;

FIG. 2 is a dissembled perspective view illustrating the probe card of FIG. 1;

FIG. 3 is a sectional perspective view illustrating a frame of the probe card of FIG. 1;

FIG. 4 is a cross sectional view cut along line A-A of FIG. 1;

FIG. 5 is a sectional perspective view of a probe unit of the probe card of FIG. 1;

FIGS. 6 to 9 are sectional perspective views illustrating different configurations of probe unit of FIG. 5; and FIG. 10 is a cross sectional view of a probe card according to another exemplary embodiment of the present invention.

BEST MODE FOR CARRYING OUT THE INVENTION

Exemplary embodiments of the present invention are described with reference to the accompanying drawings in detail. The same reference numbers are used throughout the drawings to refer to the same or like parts. Detailed descriptions of well-known functions and structures incorporated herein may be omitted to avoid obscuring the subject matter of the present invention.

FIG. 1 is a perspective view illustrating a configuration of a probe card according to an exemplary embodiment of the present invention; FIG. 2 is a dissembled perspective view illustrating the probe card of FIG. 1; and FIG. 3 is a sectional perspective view illustrating a frame of the probe card of FIG. 1.

A probe card 100 is used for testing the electrical characteristics of a plurality of chips simultaneously. For simplifying the explanation, the probe card according to this embodiment is provided with 48 probe units (PU).

Referring to FIGS. 1 and 2, the probe card 100 includes a plurality of probe units (PUs) and space transformers (ST), a frame (FR), a plurality of interposers, and a printed circuit board (IB).

Each probe unit (PU) includes a plurality of probes (P) for contacting a corresponding chip pad and a guide member (G) securing the probe (P). Each space transformer (ST) is provided with wires (not shown) electrically connected to bottom terminals of the probes (P) and separately support the corresponding probe unit (PU).

The frame (FR) is provided with a plurality of probe guide slots (PGS) for tightly receiving the probe units (PU) so as to minimize the position displacements of the probe units (PU) caused by thermal distortion of the probe card.

The interposer is arranged below the space transformer (ST) for supporting the space transformer (ST) and includes electrical members (not shown) for bridging test signals to the wires of the space transformer (ST).

The printed circuit board (IB) is arranged below the interposers for supporting the interposers and supply the test signals through the electrical members of the interposers.

In FIGS. 1 and 2, the probe card is assembled by using flatness adjustment screws (PSCR) for adjusting flatness of the frame (FR), coupling screws (CSCR) for coupling the printed circuit board (IB) and the frame (FR), zif connectors (ZIFC), and reinforcement plate (STFF).

The flatness adjustment screws (PSCR) are penetrating the frame (FR), space transformers (ST), interposers, and printed circuit board (IB).

Each space transformer (ST) is a printed circuit board formed by laminating multiple layers of Frame Retardant 4 (FR4), ceramic, or glass. The space transformer (ST) is composed at least one block in consideration of the size of a chip to be tested. The frame (FR) is made of a material having low thermal expansion coefficient such as Invar, Kovar, quartz, steel, and ceramic and provided with the guide slots (PGS) for fixedly receiving the probe units (PU) as shown in FIG. 3.

The thermal expansion coefficient of the metal alloy such as the Inver and Kovar is in the range between 1 ppm/and 5 ppm/close that of the silicon which is a material of the wafer.

The probe card 100 is provided with the space transformers (ST) made of multi-layered printed circuit board which can be obtained through a relatively simple fabrication procedure. By forming the space transformer (ST) in the structure of divided blocks while maintaining predetermined gaps in between, it is possible to prevent the probes from mismatching the contact points of the space transformer by different thermal expansion coefficients of the probe and space transformer (ST). Also, the problem of mismatches between the probe tips and the contact points can be solved by securing the probe units (PU) through the guide slots (PGS) of the frame (FB) made of metal alloy having a low thermal expansion coefficient.

Since the space transformer (ST) is expanded and contracted on the axis of the center of the space transformer, the position displacements of the blocks of the space transformer (ST) can be minimized due to the gaps between the blocks. Thus, the contact failure problem of the space transformer (ST) caused by the high thermal expansion coefficient can be solved.

Referring to FIGS. 2 and 3, the probe units (PU) are inserted into the corresponding guide slots and mounted on the respective space transformers (ST).

The space transformer (ST) of the probe card 100 according to the present invention can be easily manufactured in comparison with the single piece space transformer of the conventional MEMS probe card.

In this embodiment, the space transformer (ST) is provided per probe unit such that, when a repair is required, the probe card can be repaired by replacing only the problematic probe units with new ones.

As the size of the probe card increases, the planarization of the probe card becomes much critical factor for guaranteeing the stable contacts of the probes on the large number of chip pads and the flatness of the probe card should be maintained below a few μm.

Typically, the flatness of the probe card is determined depending on the flatness of the space transformer on which the probes are mounted and the probe tip assembly tolerance. As the size of the probe card increases, the space transformer (ST) should be manufactured with thicker plate so as to have rigid stiffness, resulting in increase of manufacturing cost and difficulty.

Also, during the soldering process for boding the probes to the space transformer (ST), the space transformer (ST) may thermally expand by the high soldering temperature, resulting in deteriorating the position accuracy of the probes.

However, the probe card of the present invention is implemented with probe units (PU) each having a size similar to that of the chip, such that the flatness of the probe card can be easily adjusted to desirable level. The entire flatness of the probes depends on the flatness of the frame with which the probe units (PU) are fixed, and the flatness of the frame can be coarsely adjusted using the flatness adjustment screws (PSCR).

FIG. 4 is a cross sectional view cut along line A-A of FIG. 1, and FIG. 5 is a sectional perspective view of a probe unit of the probe card of FIG. 1.

Referring to FIG. 4, the probe units (PU) protrude through respective guide slots of the frame (FR) so as to be fixed. The bottom surface of each probe unit (PU) contact the corresponding pad (STP) of the space transformer (ST). The space transformer (ST) is mounted on the bottom surface of the probe unit (PU) and separated from neighbor space transformers (ST). That is, a probe unit (PU) and a space transformer (ST) are structured as a unit block.

Since the probe units (PU) are tightly inserted into the respective guide slots, contact failure caused by thermal distortion of the probes (P) can be avoided. Also, since the space transformers (ST) are separately arranged with gaps in between, the thermal distortion of a space transformer (ST) does not influence to neighbor space transformers (ST).

Each space transformer (ST) is provided with measurement devices (CMP) for improving test performance to the chip on an upper surface. The measurement devices (CMP) are plugged into holes formed on the bottom surface of the frame. The measurement devices may include capacitor, inductor, and resistor.

For example, a capacity may be arranged between an electrical wire (not shown) and a ground wire (not shown) patterned on the space transformer (ST) for reducing noise and surge pulse on the electrical wire and thus securing appropriate performance of the chip. Also, an impedance matching device can be placed.

The space transformers (ST) are supported by an interposer array arranged below the space transformers (ST). The interposer array is provided with electrical members (not shown) for delivering the test signal received through wires (not shown) distributed in the space transformer (ST). The interposer array is composed of interposers (IPS) for supporting respective space transformers (ST).

In FIG. 4, each space transformer (ST) is supported by an interposer (IPS). Accordingly, the interposers (IPS) are separated from each other as the space transformers are. However, the interposer arrangement is not limited thereto. For example, the interposer array can be configured such that an interposer (IPS) supports more than one spacer transformer (ST).

The interposer (IPS) is an electrical connection means for supplying the test signal from a pad (IBP) of the printed circuit board (IB) to a lower surface pad (STP) of the space transformer (ST).

In FIG. 4, the interposer (IPS) is depicted such that a plurality of pogo pins (PP) penetrating respective pogo pin guide holes (PG). However, the pogo pin structure can be replaced by other types of electrical connection means.

The printed circuit board (1P) and the reinforcement plate (STFF) for reinforcing the printed circuit board (IP) are arranged below the interposers (IPS). The flatness adjustment screws (PSCR) penetrate the reinforcement plate (STFF), printed circuit board (IB), interposers (IPS), space transformers (ST), and frame (FR), and the flatness of the frame can be roughly adjusted by screwing the flatness adjustment screws (PSCR).

Referring to FIG. 5, each probe unit (PU) includes a guide member having a plurality of upper holes (HG1) and lower holes (HG3) formed in its upper and lower layers and a plurality of middle holes (HG2) formed in a middle layer for connecting respective pairs of upper and lower holes (HG1 and HG3) and a plurality of probes (P) situated in the upper, middle, and lower holes so as to contact a chip pad (DUT) of the chip to be tested.

The guide member (G) is formed so as to receive and support the probes (P). As shown in FIG. 5, the middle hole (HG2) is formed in the shape of a narrow slit such that the probe (P) is allowed moving only in vertical direction. The upper and lower holes (HG1 and HG2) are formed on the same sectional plane of the middle hole (HG2).

In FIG. 5, the probe (P) is formed in the shape of "⊏" of which both ends are bent at 90 degree outward. However, the shape of the probe can be modified according to the positions of the upper and lower holes (HG1 and HG2).

As shown in FIG. 5, the guide member (G) is composed of three thin substrates. The three substrates are provided with the upper holes (HG1), lower holes (HG3), and middle holes (HG2), respectively.

The holes (HG1, HG2, and HG3) can be formed using a dry or wet etching technique or a laser cutting technique, and the substrates are laminated using various bonding techniques.

It is obvious to those skilled in the art that the holes and the lamination of the substrates can be accomplished using various techniques.

Although the guide member (G) is composed of three substrates, the number of the substrates can be changed. For example, the guide member (G) can be formed by folding two substrates: one having the holes with a shape obtained by combining an upper half part of the middle hole and the upper hole and the other having the holes with a shape obtained by combining a low half part of the middle hole and the lower hole.

Each probe (P) is situated along the upper, middle, and lower holes formed in the same section plane so as not to be bent, resulting in achievement of narrow pitch.

FIGS. 6 to 9 are sectional perspective views illustrating different configurations of probe unit of FIG. 5.

The probe unit of FIG. 6 is configured for testing a chip of which pads are arranged along its center line. The probe unit of FIG. 7 is configured for testing a chip of which pads are arranged along its perimeter. The probe unit of FIG. 8 is configured for testing a chip of which pads are arranged along its perimeter and the guide block of the probe unit is formed by laminating five substrates. The probe unit of FIG. 9 is configured for testing a chip of which pads are arranged in a planar pattern.

As shown in the drawings, the probe card 100 can be configured with various probe patterns, and the probe unit can be implemented with guide members formed by laminating multiple substrates.

FIG. 10 is a cross sectional view of a probe card according to another exemplary embodiment of the present invention.

In FIG. 10, the structures and functions of the elements of the probe card 200 are identical with those of the probe card 100 of FIG. 4 except for position and structure of the frame (FR) and position of the flatness adjustment screws (PSCR). Accordingly, the structure and functions of the frame (FR) and flatness adjustment screws (PSCR) are mainly described hereinafter.

The probe card 200 of FIG. 10 includes the probe units (PU), interposers (IPS), frame (FR), and printed circuit board (IB).

The interposers (IPS) are arranged below the space transformers (ST) for supporting the space transformers (ST) and provided with electrical connection means for delivering test signal to the wires of the space transformer (ST). Each interposer (IPS) are arranged to support at least one space transformer (ST) as in the embodiment of FIG. 4.

The frame (FR) can be made of a material such Invar, Kovar, quartz, steel, and ceramic and is provided with holes for tightly receiving the interposers (IPS) and supports the space transformers (ST). That is, the frame (FR) is arranged between the interposers (IPS). The frame (FR) minimizes the position displacements of the space transformers (ST) that are separated from each other, and the space transformers (ST) minimizes the position displacement of the pads (STP) on the space transformers (ST).

The flatness adjustment screws (PSCR) penetrate the space transformers (ST), frame (FR), printed circuit board (IB) and reinforcement plate (STFF) and adjust the flatness of the upper surfaces of the space transformers.

Although exemplary embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

INDUSTRIAL APPLICABILITY

The probe block of the present invention can be applied to various types of testing systems for testing electrical characteristics of circuits on the wafer chips or printed circuit boards.

The invention claimed is:

1. A probe card comprising:
a plurality of probe units, each comprising a guide member and at least one probe secured by the guide member and contacting a chip pad to be tested;
a plurality of space transformers arranged below the respective probe units, each space transformer having wires electrically connected to lower terminals of the probes;
a frame having a plurality of guide holes for fixedly positioning the respective probe units;
an interposer array arranged below the space transformers for supporting the space transformers, the interposer array comprising electrical connection means for supplying test signals to the wires of the space transformers; and
a printed circuit board arranged below the interposer array for supporting the interposer array and electrically connected to the electrical connection means for supplying the test signals,
wherein each space transformer comprises measurement devices arranged on an upper surface for enhancing test performance to a device to be tested,
wherein the frame comprises a plurality of holes on a bottom surface for receiving the measurement devices, and the frame being made of any of Invar, Kovar, quartz, steel, and ceramic.

2. The probe card of claim 1, wherein each space transformer comprises a multi-layered printed circuit board.

3. The probe card of claim 1, further comprising a plurality of flatness adjustment screws penetrating the frame, space transformers, interposer array, and printed circuit board, for adjusting flatness of an upper surface of the frame.

4. A probe card comprising:
a plurality of probe units, each comprising a guide member and at least one probe secured by the guide member and contacting a chip pad to be tested;
a plurality of space transformers arranged below the respective probe units, each space transformer having wires electrically connected to lower terminals of the probes;
a frame having a plurality of guide holes for fixedly positioning the respective probe units;
an interposer array arranged below the space transformers for supporting the space transformers, the interposer array comprising electrical connection means for supplying test signals to the wires of the space transformers; and
a printed circuit board arranged below the interposer array for supporting the interposer array and electrically connected to the electrical connection means for supplying the test signals, wherein each probe unit comprises:
a guide having at least one set of upper hole, lower hole, and middle hole interconnecting the upper and lower holes, the middle hole being greater than the upper and lower holes in size; and
at least one probe situated in the set of upper, lower, and middle holes and a tip of the probe contact a chip pad to be tested.

5. The probe card of claim 1, wherein the interposer array comprises a plurality of interposers, each interposer supporting at least one space transformer.

* * * * *